(12) United States Patent
Zhou

(10) Patent No.: US 11,545,388 B2
(45) Date of Patent: Jan. 3, 2023

(54) STAIRCASE FORMATION IN THREE-DIMENSIONAL MEMORY DEVICE

(71) Applicant: Yangtze Memory Technologies Co., Ltd., Hubei (CN)

(72) Inventor: Yu Ting Zhou, Hubei (CN)

(73) Assignee: Yangtze Memory Technologies Co., Ltd., Hubei (CN)

(*) Notice: Subject to any disclaimer, the term of this patent is extended or adjusted under 35 U.S.C. 154(b) by 56 days.

(21) Appl. No.: 17/318,589

(22) Filed: May 12, 2021

(65) Prior Publication Data

US 2021/0265203 A1 Aug. 26, 2021

Related U.S. Application Data

(60) Continuation of application No. 17/103,423, filed on Nov. 24, 2020, now Pat. No. 11,361,988, which is a
(Continued)

(51) Int. Cl.
*H01L 21/76* (2006.01)
*H01L 21/31* (2006.01)
(Continued)

(52) U.S. Cl.
CPC .. *H01L 21/76816* (2013.01); *H01L 21/31111* (2013.01); *H01L 21/31144* (2013.01);
(Continued)

(58) Field of Classification Search
CPC ......... H01L 21/76816; H01L 21/31111; H01L 21/31144; H01L 21/76877; H01L 23/5226; H01L 23/5283
(Continued)

(56) References Cited

U.S. PATENT DOCUMENTS

| 8,449,805 B2 | 5/2013 | Sandhu |
| 8,928,149 B2 | 1/2015 | Chen |
(Continued)

FOREIGN PATENT DOCUMENTS

| CN | 106409811 A | 2/2017 |
| CN | 109155317 A | 1/2019 |
(Continued)

OTHER PUBLICATIONS

International Search Report and Written Opinion of the International Searching Authority directed to related International Patent Application No. PCT/CN2019/074073, dated Oct. 28, 2019; 8 pages.

*Primary Examiner* — Sheikh Maruf
(74) *Attorney, Agent, or Firm* — Sterne, Kessler, Goldstein & Fox P.L.L.C.

(57) ABSTRACT

A method for forming a staircase structure of 3D memory, including: forming an alternating layer stack comprising a plurality of dielectric layer pairs disposed over a substrate; forming a first mask stack over the alternating layer stack; patterning the first mask stack to define a staircase region comprising a number of N sub-staircase regions over the alternating layer stack using a lithography process and N is greater than 1; forming a first staircase structure over the staircase region, the first staircase structure has a number of M steps at each of the staircase regions and M is greater than 1; and forming a second staircase structure on the first staircase structure, the second staircase structure has a number of 2*N*M steps at the staircase region.

20 Claims, 11 Drawing Sheets

Related U.S. Application Data division of application No. 16/422,464, filed on May 24, 2019, now Pat. No. 10,896,844, which is a continuation of application No. PCT/CN2019/074073, filed on Jan. 31, 2019.

(51) Int. Cl.
| | |
|---|---|
| *H01L 21/768* | (2006.01) |
| *H01L 27/11556* | (2017.01) |
| *H01L 27/11582* | (2017.01) |
| *H01L 23/528* | (2006.01) |
| *H01L 21/311* | (2006.01) |
| *H01L 23/522* | (2006.01) |

(52) U.S. Cl.
CPC .... *H01L 21/76877* (2013.01); *H01L 23/5226* (2013.01); *H01L 23/5283* (2013.01); *H01L 27/11556* (2013.01); *H01L 27/11582* (2013.01)

(58) Field of Classification Search
USPC .......................................................... 257/314
See application file for complete search history.

(56) References Cited

U.S. PATENT DOCUMENTS

| | | | |
|---|---|---|---|
| 9,099,538 B2 | 8/2015 | Shih et al. | |
| 9,478,546 B2 | 10/2016 | Yang | |
| 10,896,844 B2 | 1/2021 | Zhou | |
| 11,145,671 B2 | 10/2021 | Lee et al. | |
| 11,296,108 B2 | 4/2022 | Ozawa | |
| 11,361,988 B2 | 6/2022 | Zhou | |
| 2010/0052042 A1 | 3/2010 | Tanaka et al. | |
| 2012/0119283 A1 | 5/2012 | Lee et al. | |
| 2012/0149201 A1 | 6/2012 | Fu et al. | |
| 2012/0306089 A1 | 12/2012 | Freeman et al. | |
| 2013/0148398 A1* | 6/2013 | Baek ................. | H01L 27/11568 257/E21.409 |
| 2013/0161818 A1* | 6/2013 | Han ................... | H01L 29/66833 438/653 |
| 2013/0161821 A1* | 6/2013 | Hwang ............. | H01L 27/11573 257/E21.585 |
| 2013/0341797 A1* | 12/2013 | Lim ................... | H01L 21/76879 257/E21.585 |
| 2014/0038400 A1 | 2/2014 | Park et al. | |
| 2014/0264925 A1 | 9/2014 | Chen | |
| 2015/0076668 A1 | 3/2015 | Shih et al. | |
| 2015/0228623 A1 | 8/2015 | Oh et al. | |
| 2015/0249112 A1 | 9/2015 | Takeguchi et al. | |
| 2016/0064281 A1* | 3/2016 | Izumi ................. | H01L 23/5226 257/315 |
| 2016/0111429 A1 | 4/2016 | Yang | |
| 2016/0148946 A1 | 5/2016 | Hironaga | |
| 2016/0181264 A1 | 6/2016 | Miyamoto et al. | |
| 2016/0181269 A1 | 6/2016 | Lai et al. | |
| 2016/0211175 A1 | 7/2016 | Chen et al. | |
| 2016/0307846 A1* | 10/2016 | Jung .................. | H01L 27/1157 |
| 2016/0322374 A1 | 11/2016 | Sano et al. | |
| 2016/0336220 A1* | 11/2016 | Lim ................... | H01L 23/5283 |
| 2016/0343821 A1 | 11/2016 | Chiou et al. | |
| 2017/0033117 A1 | 2/2017 | Lee | |
| 2017/0092541 A1 | 3/2017 | Or-Bach et al. | |
| 2017/0117182 A1* | 4/2017 | Lee .................... | H01L 29/78 |
| 2017/0141032 A1 | 5/2017 | Lee | |
| 2017/0317088 A1 | 11/2017 | Lee | |
| 2017/0373088 A1 | 12/2017 | Lee | |
| 2018/0090511 A1 | 3/2018 | Nakajima | |
| 2018/0130701 A1* | 5/2018 | Chun ................. | H01L 21/31111 |
| 2018/0145029 A1 | 5/2018 | Tanzawa | |
| 2018/0277561 A1 | 9/2018 | Yamamoto | |
| 2018/0301372 A1 | 10/2018 | Noh | |
| 2018/0301460 A1* | 10/2018 | Yoo ................... | H01L 21/0234 |
| 2019/0146330 A1 | 5/2019 | Yang | |
| 2019/0214404 A1 | 7/2019 | Ahn et al. | |
| 2019/0295893 A1* | 9/2019 | Lee ................... | H01L 27/11524 |
| 2019/0319042 A1 | 10/2019 | Baek et al. | |
| 2019/0355738 A1 | 11/2019 | Zhao et al. | |
| 2020/0251381 A1 | 8/2020 | Zhou | |
| 2021/0098288 A1 | 4/2021 | Zhou | |

FOREIGN PATENT DOCUMENTS

| | | |
|---|---|---|
| JP | 2020-113766 A | 7/2020 |
| JP | 2020-126928 A | 8/2020 |
| TW | 201436100 A | 9/2014 |
| TW | 201513268 A | 4/2015 |
| TW | 201626457 A | 7/2016 |
| TW | 201834217 A | 9/2018 |
| TW | 201836061 A | 10/2018 |

* cited by examiner

STAIRCASE FORMATION IN THREE-DIMENSIONAL MEMORY DEVICE

CROSS REFERENCE TO RELATED APPLICATIONS AND INCORPORATION BY REFERENCE

This application is a continuation of U.S. patent application Ser. No. 17/103,423 filed on Nov. 24, 2020 and titled "Staircase Formation in Three-Dimensional Memory Device," which claims priority to U.S. patent application Ser. No. 16/422,464 filed on May 24, 2019 and issued as U.S. Pat. No. 10,896,844 on Jan. 19, 2021, which claims priority to International Patent Application No. PCT/CN2019/074073 filed on Jan. 31, 2019, all of which are incorporated herein by reference in their entirety.

BACKGROUND

Embodiments of the present disclosure relate to three-dimensional (3D) memory devices and fabrication methods thereof.

Planar memory cells are scaled to smaller sizes by improving process technology, circuit designs, programming algorithms, and the fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array. A typical 3D memory architecture includes a stack of gate electrodes arranged over a substrate, with a plurality of semiconductor channels through and intersecting word lines into the substrate. The intersection of a word line and a semiconductor channel forms a memory cell.

The 3D memory architecture requires an electrical contact scheme to allow the control of each individual memory cells. One electrical contact scheme is to form a staircase structure to connect to word lines of each individual memory cells. Staircase structures have been used to connect more than 32-word lines along a semiconductor channel in a typical 3D memory device.

As semiconductor technology advances, 3D memory devices, such as 3D NAND memory devices, keep scaling more oxide/nitride (ON) layers. As a result, the existing multi-cycle trim and etch processes used to form such staircase structures suffer a low throughput and are expensive.

BRIEF SUMMARY

Embodiments of a method for forming a staircase structure of 3D memory devices are disclosed herein. The disclosed structures and methods provide numerous benefits including, but not limiting to, reduce fabrication complexity and manufacturing cost of 3D memory devices.

In some embodiments, a method for forming a 3D memory device, includes: forming an alternating layer stack including a plurality of dielectric layer pairs disposed over a substrate; forming a first mask stack over the alternating layer stack; patterning the first mask stack to define a staircase region including a number of N sub-staircase regions over the alternating layer stack and N is greater than 1; forming a first staircase structure over the staircase region, the first staircase structure having a number of M steps at each of the staircase regions and M is greater than 1; and forming a second staircase structure on the first staircase structure, the second staircase structure having a number of 2*N*M steps at the staircase region. In some embodiments, the method further includes forming a plurality of vertical semiconductor channels in a stack storage region on the substrate. In some embodiments, each of the staircase regions is adjacent to the stack storage region.

In some embodiments, a 3D memory device includes: an alternating layer stack disposed over a substrate; a storage structure including a plurality of vertical semiconductor channels; a plurality staircase region adjacent to the storage structure; and a staircase structure disposed at each of the staircase regions to expose a portion of a plurality of layer stacks of the alternating layer stack. In some embodiments, the staircase structure includes a number of N sub-staircase regions and N is greater than 1. In some embodiments, each N sub-staircase region includes 2*M steps and M is greater than 1.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
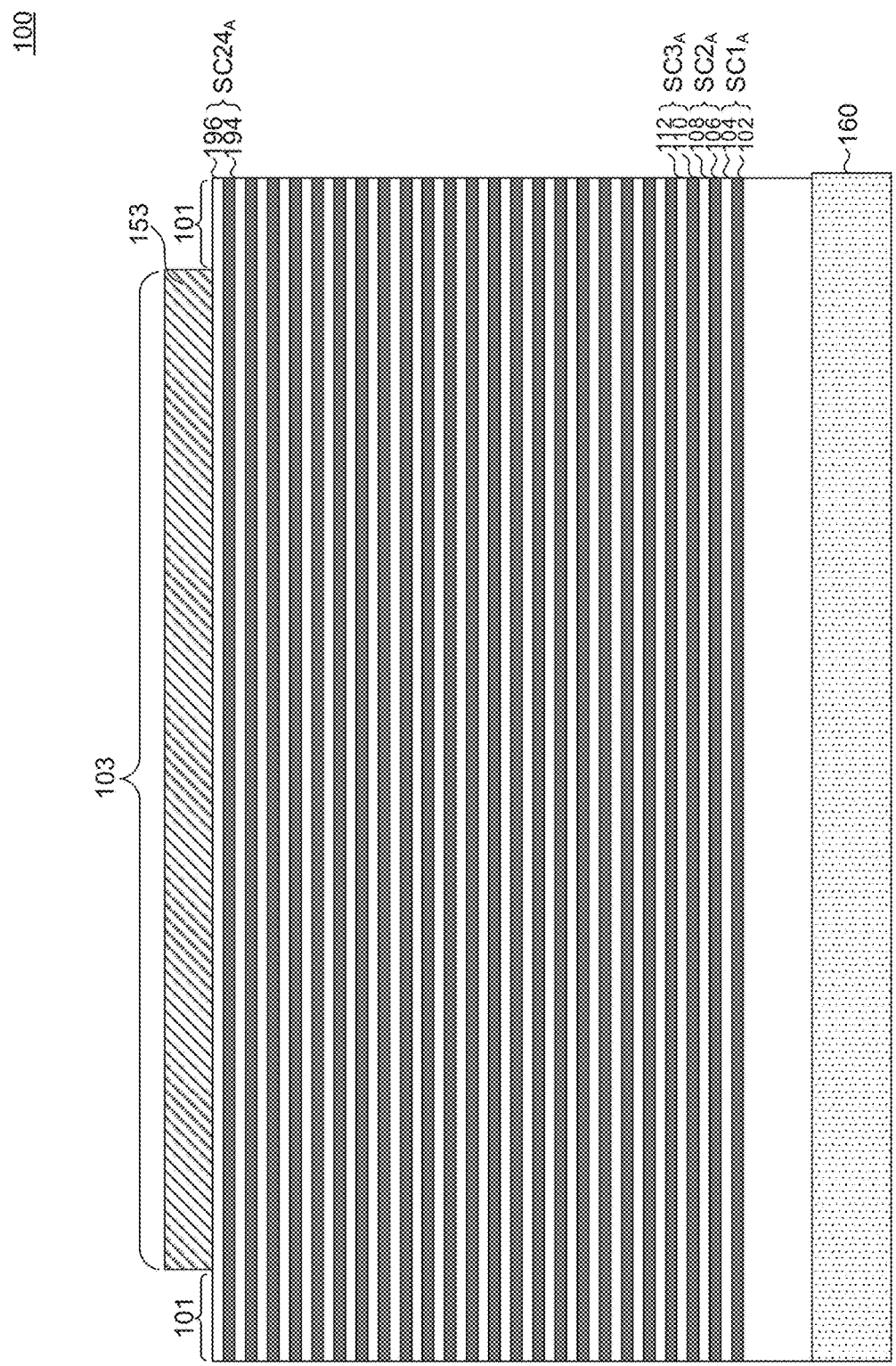
FIG. 1 illustrates a cross-sectional view of a plurality of dielectric layer pairs by a patterned photoresist stack, in accordance with some embodiments.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a top surface and a bottom surface. The top surface of the substrate is where a semiconductor device is formed, and therefore the semiconductor device is formed at a top side of the substrate. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In some embodiments, a NAND string or a 3D memory device includes a semiconductor channel (e.g., a silicon channel) that extends vertically through a plurality conductor/dielectric layer pairs. The plurality of conductor/dielectric layer pairs are also referred to herein as an "alternating conductor/dielectric stack." The conductor layer of the alternating conductor/dielectric stack can be used as a word line (electrically connecting one or more control gates). An intersection of a word line and the semiconductor channel forms a memory cell. Vertically-oriented memory strings require an electrical connection between the conductive materials (e.g., word line plates or control gates) and access lines (e.g., word lines) so that each of the memory cells along the memory strings or in the 3D memory device can be uniquely selected for writing or reading functions.

In 3D memory device architectures, memory cells for storing data are vertically stacked to form a stacked storage structure. 3D memory devices can include a staircase structure formed on one or more sides of the stacked storage structure for purposes such as word line fan-out, where the stacked storage structure includes a plurality of semiconductor channels, where the semiconductor channels can be vertical or horizontal. As the demand for higher storage capacity continues to increase, the number of vertical levels of the stacked storage structure also increases. Accordingly, a thicker mask layer, such as photoresists (PR) layer, is needed to etch the staircase structure with increased levels. However, the increase of thickness of the mask layer can make the etch control of the staircase structure more challenging.

In the present disclosure, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. Each of the horizontal surfaces is referred as a "step" or "staircase" of the staircase structure. In the present disclosure, a horizontal direction can refer to a direction (e.g., the x-axis or the y-axis) parallel with a top surface of the substrate (e.g., the substrate that provides the fabrication platform for formation of structures over it), and a vertical direction can refer to a direction (e.g., the z-axis) perpendicular to the top surface of the structure.

A staircase structure can be formed from a dielectric stack layer by repetitively etching the dielectric stack layer using a mask layer formed over the dielectric stack layer. In some embodiments, the mask layer can include a photoresist (PR) layer. In the present disclosure, the dielectric stack layer includes a plurality of alternatively arranged dielectric layer pairs, and the thickness of each dielectric layer pair is one level. In other words, each of the dielectric layer pair is one level high vertically. In the present disclosure, term "staircase" and term "step", used interchangeably, refer to one or more levels of a staircase structure and a step (or staircase) exposes a portion of a surface of a dielectric layer pair. In some embodiments, the dielectric layer pair includes alternating a first material layer and a second material layer. In some embodiments, the first material layer includes an insulating material layer. In some embodiments, the second material includes a sacrificial material layer or a conductive material layer. In some embodiments, the first material layer and the second material layer in one dielectric layer pair can have nominally the same height over the substrate so that one set can form one step. During the formation of the staircase structure, the mask layer is trimmed (e.g., etched incrementally) and used as the etch mask for etching the exposed portion of the dielectric stack. The amount of trimmed mask layer can be directly relevant (e.g., determinant) to the dimensions of the staircases. The trimming of the mask layer can be obtained using a suitable etch, e.g., an isotropic dry etch or a wet etch. One or more mask layers can be formed and trimmed consecutively for the formation of the staircase structure. Each dielectric layer pair can be etched, after the trimming of the mask layer, using suitable etchants to remove a portion of both the first material layer and the second material layer. After the formation of the staircase structure, the mask layer can be removed. In some embodiments, the second material layers are conductive material layers, and therefore can be gate electrodes (or word lines) of the 3D memory structure. In some embodiments, the second material layers of the staircase structure are sacrificial material layers and can then be replaced with metal/conductor layers (e.g., tungsten) to form the gate electrodes (or word lines) of the 3D memory structure.

The staircase structure can provide an interconnection scheme as word line fan-out to control the semiconductor channels after an interconnect formation process. Each of the dielectric layer pairs in the staircase structure intersect to a portion of a semiconductor channel. After replacing each of the sacrificial layers with metal/conductor layers, each of the conductive material layers in the staircase structure can control the portion of the semiconductor channel. An example of an interconnect formation process includes disposing or otherwise depositing, a second insulating material, such as silicon oxide, spin-on-dielectric, or borophosphosilicate glass (BPSG), over the staircase structure and planarizing the second insulating material. Each of the conductive material layers in the staircase structure is exposed to open a plurality of contact holes in the planarized second insulating material and the contact holes are filled with one or more conductive materials, such as titanium nitride and tungsten, to form a plurality of VIA (Vertical Interconnect Access) structures.

In the present disclosure, the term "SC" refers to a dielectric layer pair within a staircase structure. In some embodiments, the staircase structure includes an alternating layer stack, and each layer stack represents an SC layer.

FIG. 1 illustrates a cross-sectional view of a plurality of dielectric layer pairs by a patterned photoresist stack, in accordance with some embodiments. Structure 100 can include a plurality of SC layers formed over (e.g., disposed on a first, such as a top, side of) a substrate 160. Each of the SC layers can include a dielectric layer pair with a first material layer (e.g., 102, 106, 110, . . . ) and a second material layer (104, 108, 112, . . . ). A mask stack material (e.g., photoresist layer) is deposited and patterned to form mask stack 153 over the SC layers. The mask stack 153 defines a region 101 and a region 103 of the SC layers. A first (e.g., top) surface of the SC layers at region 101 is exposed and the SC layers at region 103 are covered by mask stack 153. In some embodiments, mask stack 153 can include photoresist or carbon-based polymer material. In some embodiments, both regions 101 and 103 are defined by mask stack 153 using one or more processes including lithography and etching process.

First material layer 102 can be a sacrificial layer including silicon nitride and second material layer 104 can be an insulating layer including silicon oxide, and vice versa. In some embodiments, the sacrificial layer is replaced with a conductive material layer (e.g., a gate metal material) subsequently to form word lines of a 3D memory device. In some embodiment, the second material layer can be a conductive material layer.

In some embodiments, the substrate on which structure 100 is formed can include any suitable material for supporting the 3D memory structure. For example, the substrate can include silicon, silicon germanium, silicon carbide, silicon on insulator (SOI), germanium on insulator (GOI), glass, gallium nitride, gallium arsenide, any suitable III-V compounds, any other suitable material, and/or combinations thereof.

In some embodiments, a thickness of each SC layer can be the same as or different from each other. In some embodiments, the sacrificial layers include any suitable material different from the insulating material layers. For example, the sacrificial layer can include one or more of poly-crystalline silicon, silicon nitride, poly-crystalline germanium, poly-crystalline germanium-silicon, any other suitable materials, and/or combinations thereof. In some embodiments, the sacrificial layer can include silicon nitride. The insulating layer can include any suitable insulating materials, e.g., silicon oxide or aluminum oxide. The conductive material layer can include any suitable conductive material. In some embodiments, the conductive material layer can include one or more of poly-crystalline silicon, silicide, nickel, titanium, platinum, aluminum, titanium nitride, tantalum nitride, tungsten nitride, any other suitable material, and/or combinations thereof. The forming of the insulating material layer, the sacrificial material layer and the conductive material layer can include any suitable deposition methods such as, for example, chemical vapor deposition (CVD), physical vapor deposition (PVD), plasma-enhanced CVD (PECVD), sputtering, metal-organic chemical vapor deposition (MOCVD), atomic layer deposition (ALD), any other suitable deposition method, and/or combinations thereof. In some embodiments, the insulating layer, the sacrificial layer and the conductive material layer are each formed by CVD.

Figure 2:
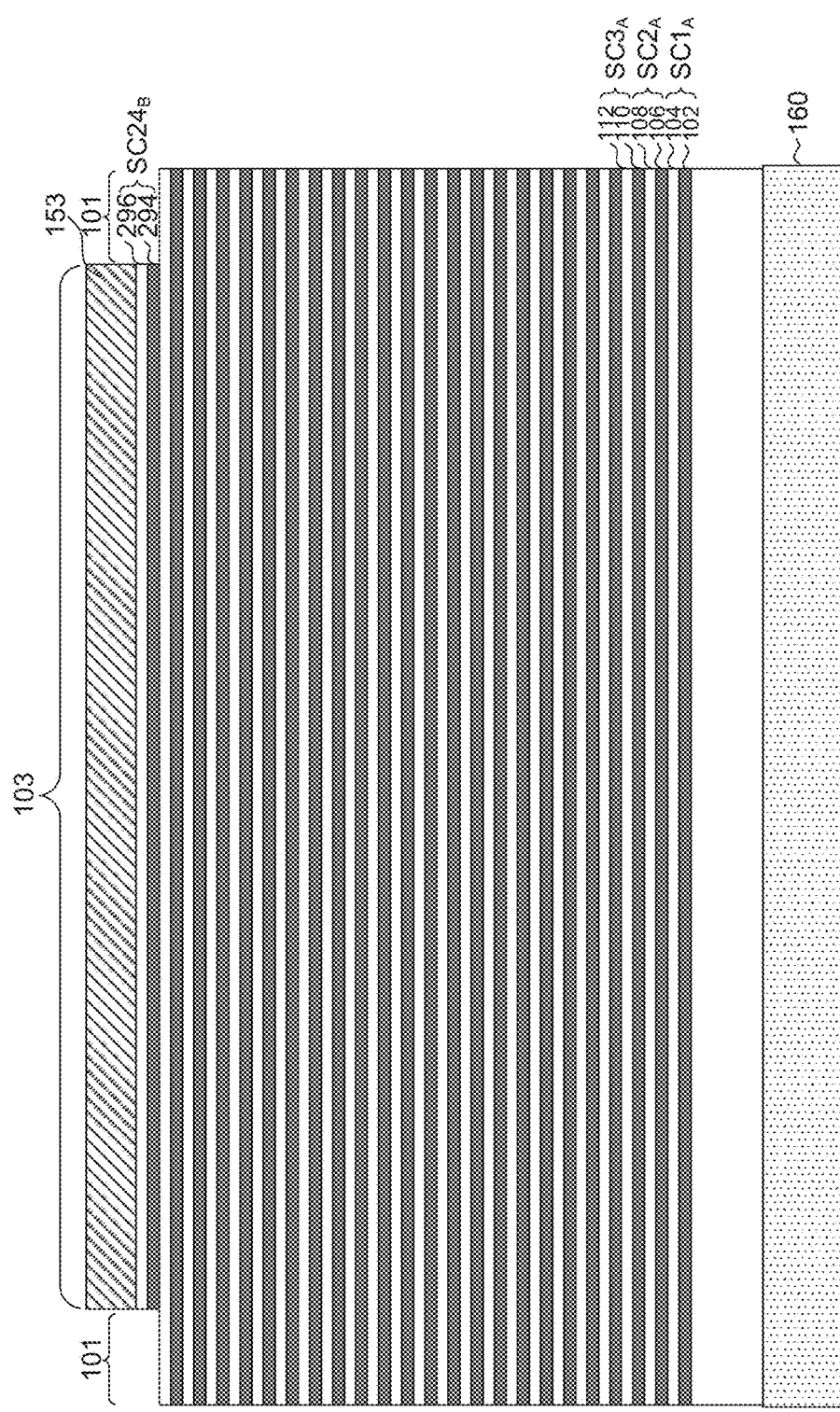
FIG. 2 illustrates a cross-sectional view of forming a first step with one level, in accordance with some embodiments.

FIG. 2 illustrates a cross-sectional view of forming a step with one level, in accordance with some embodiments. Staircase structure 200 is formed by creating step $SC24_B$ (staircase with one level step) on structure 100. In some embodiments, mask stack 153 is removed after the formation of step $SC24_B$. Step $SC24_B$ has one level, including layers 294 and 296, and is formed by performing an etching process to remove at least a portion of a single SC layer from first region 101 defined by mask stack 153. In some embodiments, the etching process includes using any suitable etchants (e.g., wet etch and/or dry etch) to sequentially remove a portion of first material layer 194 and second material layer 196. In some embodiments, two different etchants are used to respectively remove a portion of first material layer 194 and a portion of second material layer 196. The etchant for first material layer 194 has a sufficient high etching selectivity over second material layer 196, and/or vice versa. Accordingly, the underlying SC layer can function as an etch-stop layer so that only the single SC layer is patterned/etched. In some embodiments, the first and the second material layers are etched using anisotropic etching such as reactive ion etch (RIE) or other dry etch. In some embodiments, the etchant includes carbon-fluorine ($CF_4$) based gases or hexafluoroethane ($C_2F_6$) based gases. In some embodiments, one etchant (e.g., of timed a wet etch process) is used to remove both the first material layer and the second material layer, and the etchant includes phosphoric acid. In various embodiments, the methods and etchants to remove a single SC layer should not be limited by the embodiments of the present disclosure.

Figure 3A:
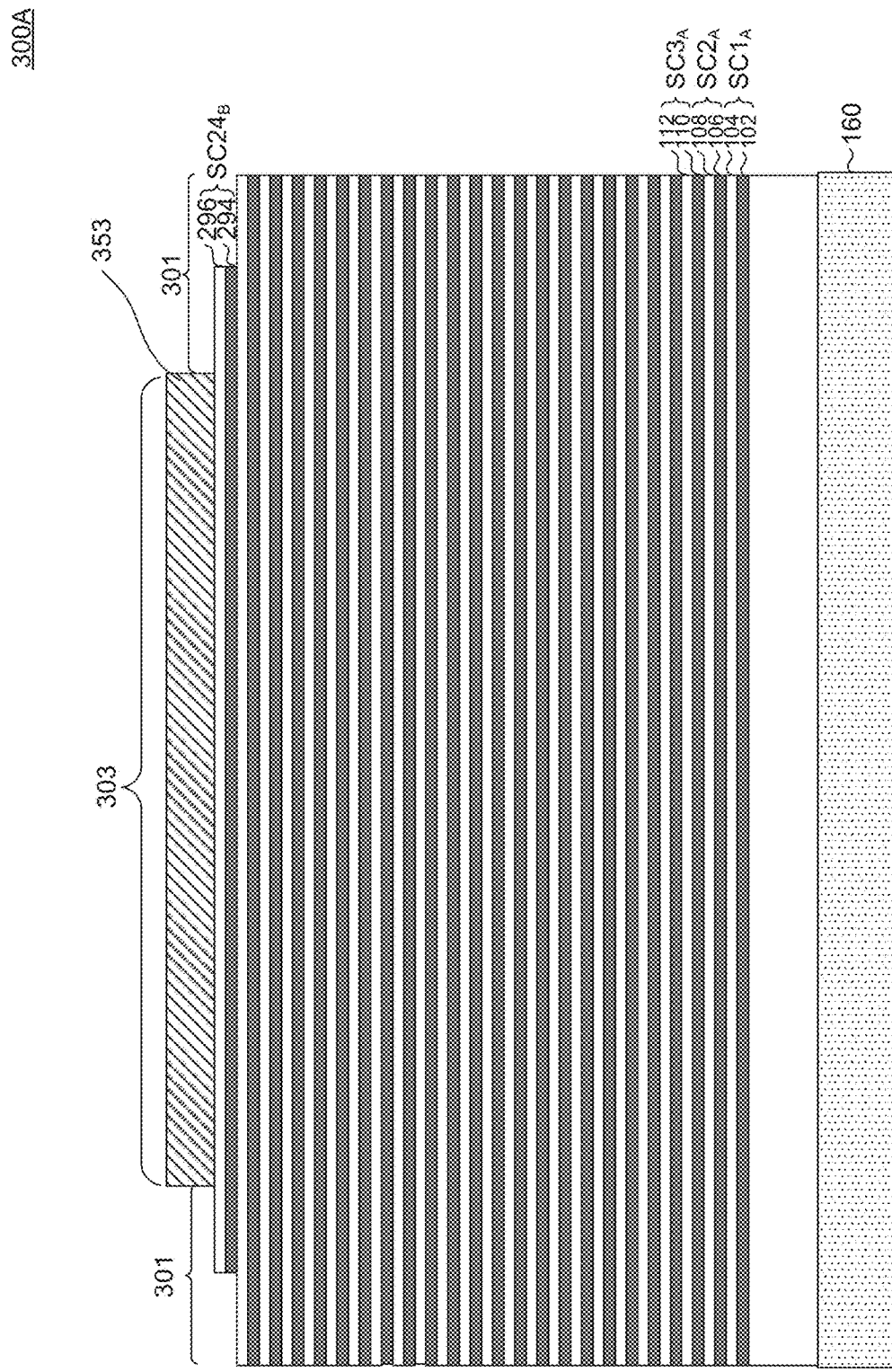
FIGS. 3A-3B illustrate a cross-sectional view of various stages of an etch-trim process that forms two steps, in accordance with some embodiments.
Figure 3B:
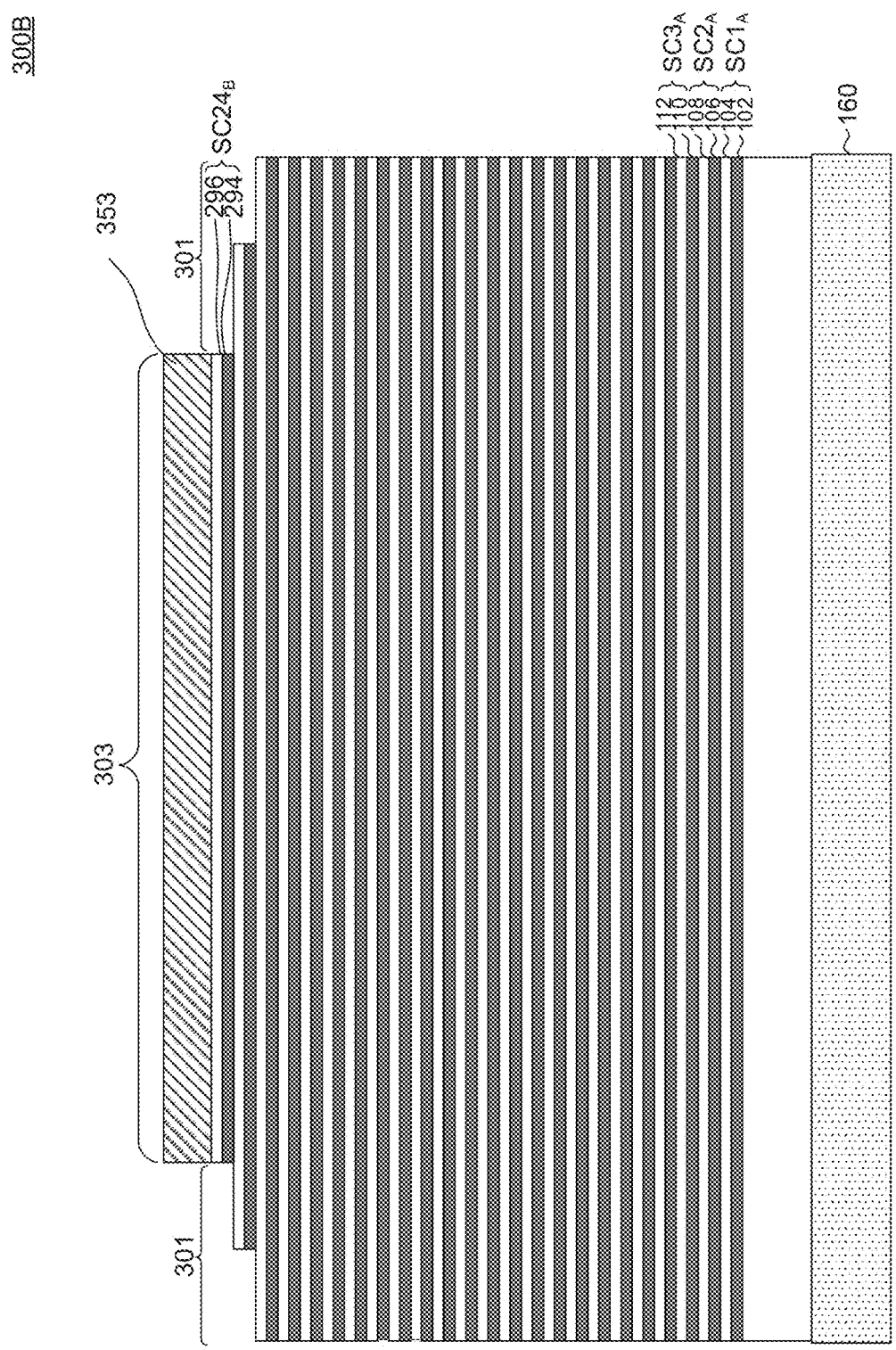

FIGS. 3A-3B exhibit structures $300_A$ and $300_B$ with an etch-trim process, which includes a trimming process (shown in FIG. 3A) and an etching process (shown in FIG. 3B). Referring to FIG. 3A, mask stack 353 is formed after applying the trimming process on mask stack 153 (shown in FIG. 1 and FIG. 2). The trimming process includes a suitable etch (e.g., an isotropic dry etch or a wet etch) and happens at directions parallel to a surface of the substrate. The amount of trimmed mask layer can be directly relevant to the lateral dimensions of the staircases. In some embodiments, mask stack 353 covers a portion (e.g., 303) of the first step created by the etching process (shown in FIG. 2). Referring to FIG. 3B, two steps, each with one levels, are created by the etching process to remove one SC layers from staircase structure $300_A$. In some embodiments, the etching process can include repetitively performing the etching process.

Figure 4A:
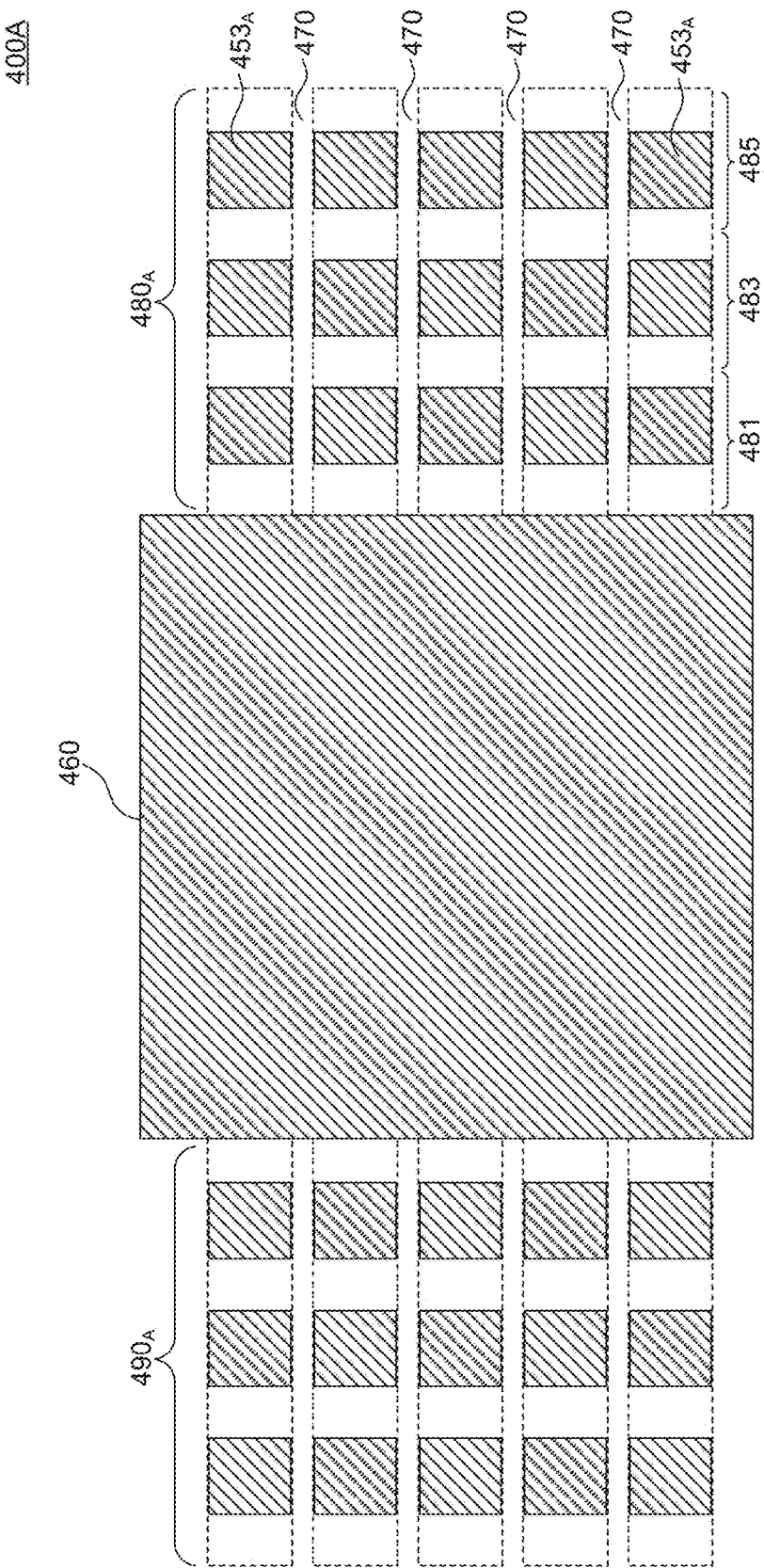
FIGS. 4A-4B illustrate a top view of a 3D memory device with a plurality of mask stacks, in accordance with some embodiments.
Figure 4B:
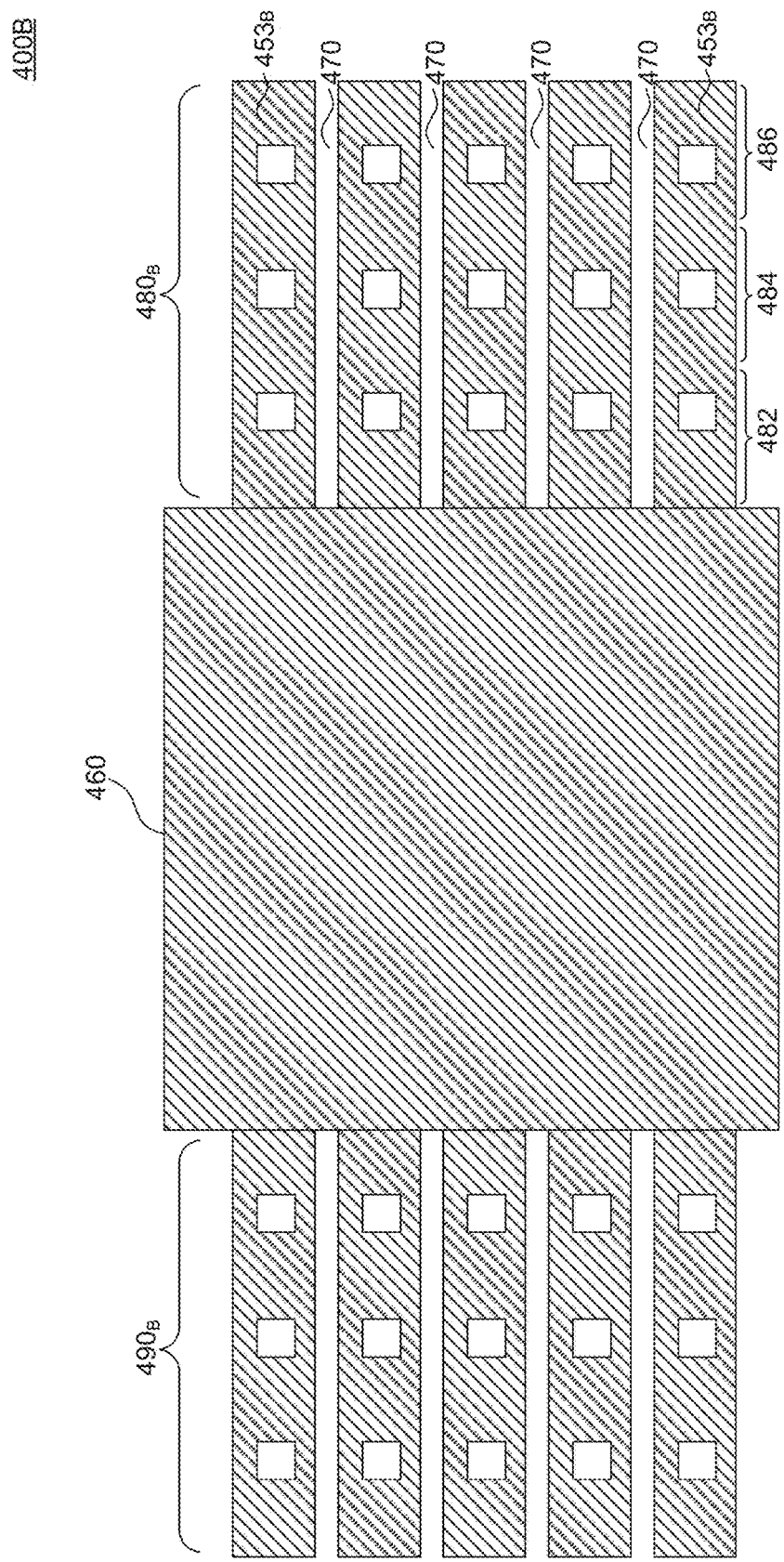

FIGS. 4A-4B show a top view of a 3D memory device (e.g., $400_A$ and $400_B$), in accordance with some embodiments of the disclosure. Referring to FIG. 4A-4B, 3D memory device $400_A$ and $400_B$ includes a stacked storage structure region 460 and a plurality of staircase regions 480 separated by slits 470. Stacked storage structure region 460 can include a plurality of semiconductor channels. In some embodiments, staircase regions 480 and 490 are distributed at different regions adjacent to stacked storage structure region 460. In some embodiments, each of staircase regions 480 is separated from each of staircase regions 490 by stack storage region 460 in a direction parallel to a surface of the substrate (e.g., x-direction or y-direction). In some embodiments, after an interconnect formation process, staircase regions 480 and 490 provide a word line fan-out to uniquely select each of memory cells along a semiconductor channel in stacked storage structure region 460. A mask stack material (e.g., photoresist layer) is deposited and patterned to form a mask stack (e.g., $453_A$ in FIG. 4A and $453_B$ in FIG. 4B) over the SC layers in the staircase regions. A portion of the top surface of the SC layers at the staircase regions (e.g., areas without photoresist) is exposed and a portion of the top surface of the SC layers are covered by the mask stack (e.g., $453_A$ in FIG. 4A and $453_B$ in FIG. 4B). In some embodiments, mask stack $453_A$ and $453_A$ can include photoresist or carbon-based polymer material. In some embodiments, one or more processes including lithography and etching process can be performed at the staircase regions. In some embodiments, an etch-trim process can be performed inwardly in a direction from a lateral edge boundary of the first mask stack toward a center of mask stack (e.g., FIG. 1-3, and FIG. 4A). In some embodiments, an etch-trim process can be performed outwardly in a direction from a center of the first mask stack to a lateral edge boundary of the mask stack (e.g., FIG. 4B). As used herein, "a lateral edge boundary" refers to the edges of the lateral surface (e.g., top and bottom surfaces) of the stack mask. The top and bottom surfaces are the two major surfaces of the mask stack, that are oppose and parallel to each other. As used herein, "a center" refers to a middle point of the lateral surface of the mask stack, equidistant from every point on the circumference of the lateral surface. In some embodiments, each staircase region 480 or 490 can be defined as a plurality of sub-staircase regions (e.g., sub-staircase regions 481, 483, 485 as shown in FIG. 4A, and sub-staircase regions 482, 484, 486 as shown in FIG. 4B). In some embodiments, the mask stack is patterned to define a staircase region including a number of N sub-staircase regions over the alternating layer stack using a lithography process and N is greater than 1 (N>1). In some embodiments, N is 2, 3, 4, 5, or 6. In some embodiments, N is 3.

Figure 5A:
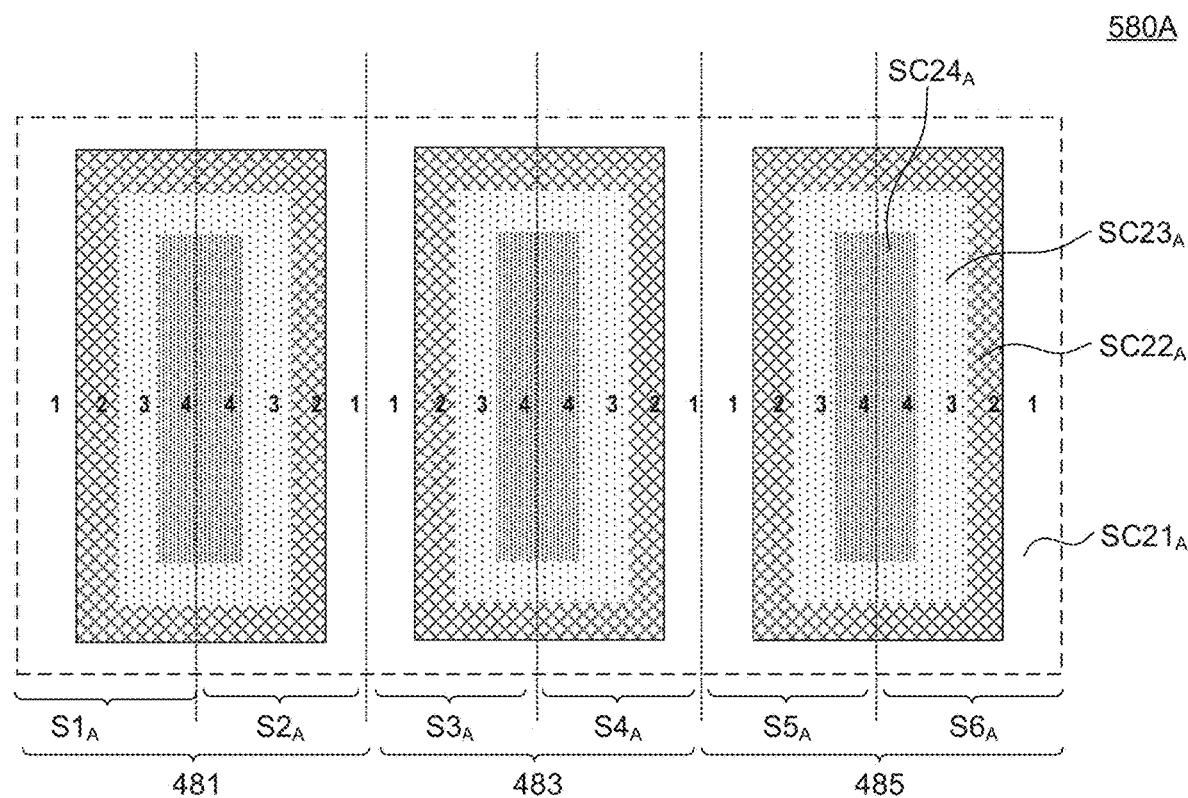
FIGS. 5A-5B illustrate a top view of staircase regions of a 3D memory device after forming a first staircase structure at each of the staircase regions, in accordance with some embodiments.
Figure 5B:
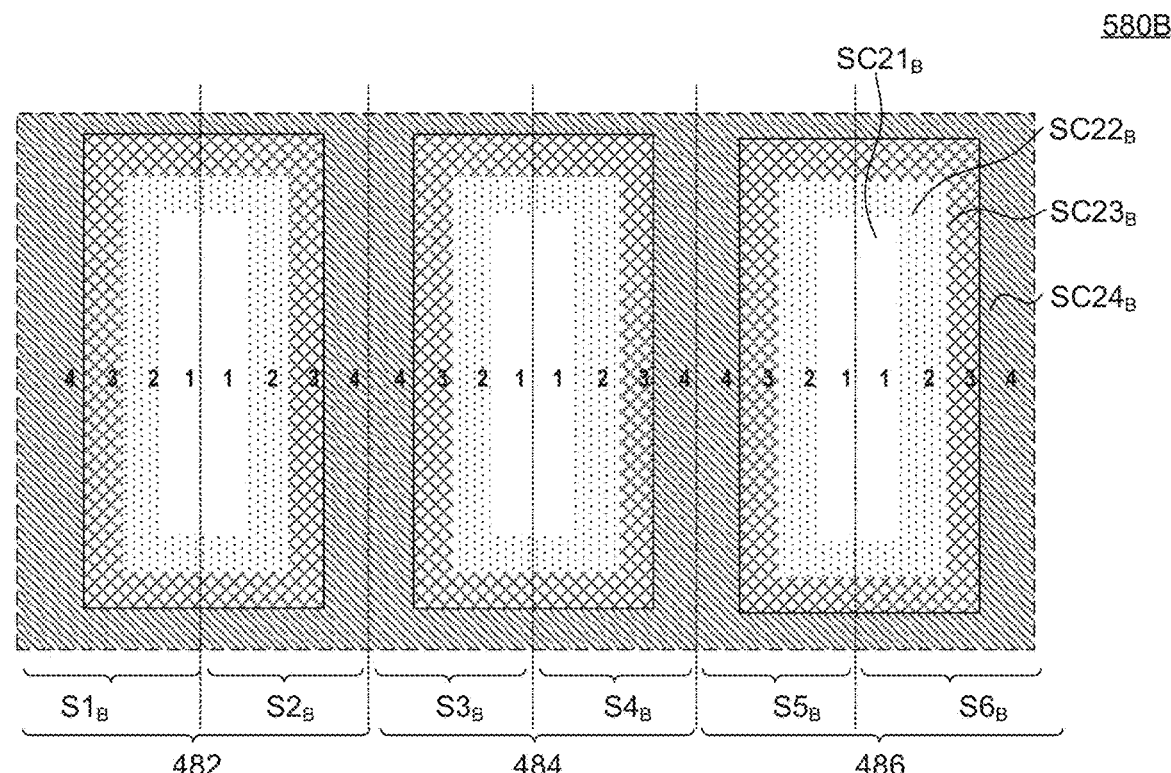

FIGS. 5A-5B show some embodiments of a top view of staircase regions 580A and 580B of a 3D memory device after forming a first staircase structure at each of staircase regions $480_A$ and $480_B$. The first staircase structure is formed by applying a repetitive etch-trim process at staircase regions $480_A$ and $480_B$ of 3D memory device $400_A$ and $400_B$. In some embodiments, the first staircase structure has four steps at each of staircase regions 580A ($SC24_A$, $SC23_A$, $SC22_A$, $SC21_A$) and 580B ($SC24_B$, $SC23_B$, $SC22_B$, $SC21_B$), and each of the four steps is one level. As the result, the first staircase structure exposes a portion of four top-most SC layers. In some embodiments, the first staircase structure has a first number (M) of steps at each of staircase regions 580A and 580B, and each of the M steps is one level, where the first number M is greater than 1 (M>1). In some embodiments, M is 2, 3, 4, 5, or 6. In some embodiments, M is 4. In some embodiments, the first staircase structure does not form at the stack storage region (stack storage region 460 as shown in FIG. 4).

Figure 5C:
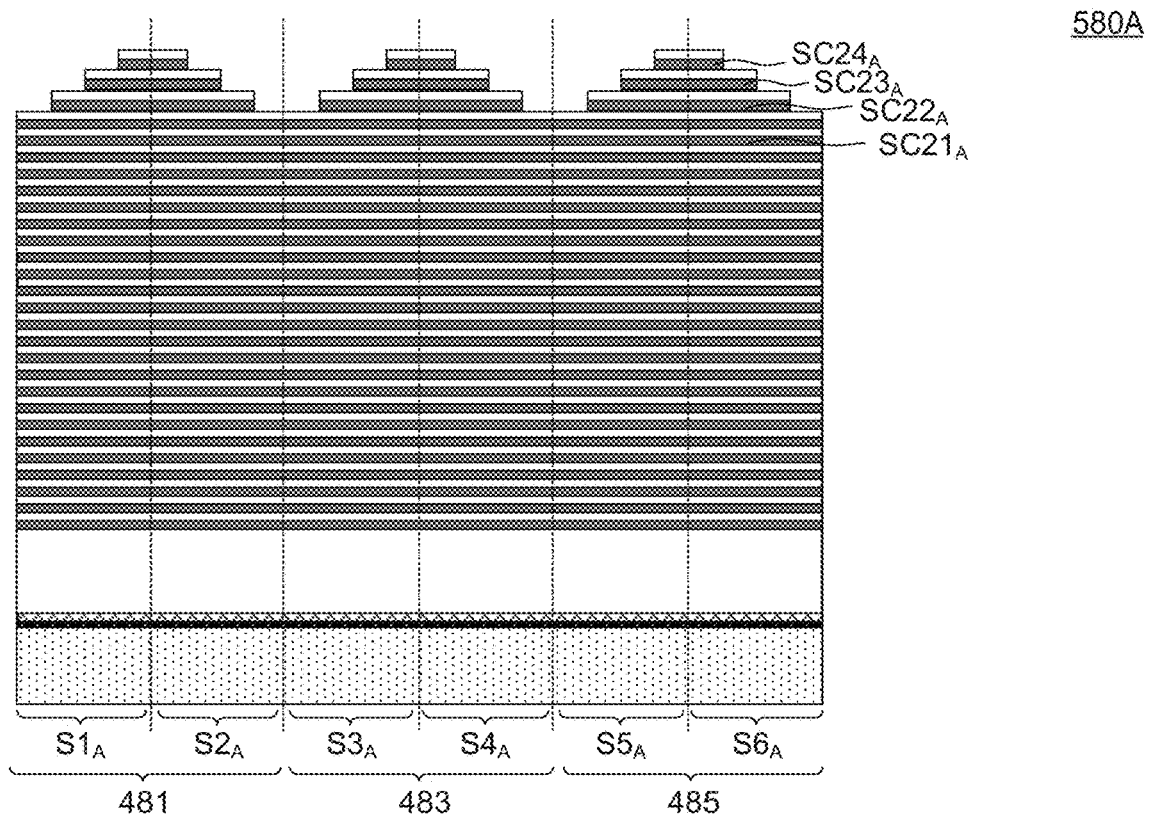
FIGS. 5C-5D illustrate a cross-sectional view of staircase regions of a 3D memory device after forming a first staircase structure at each of the staircase regions, in accordance with some embodiments.
Figure 5D:
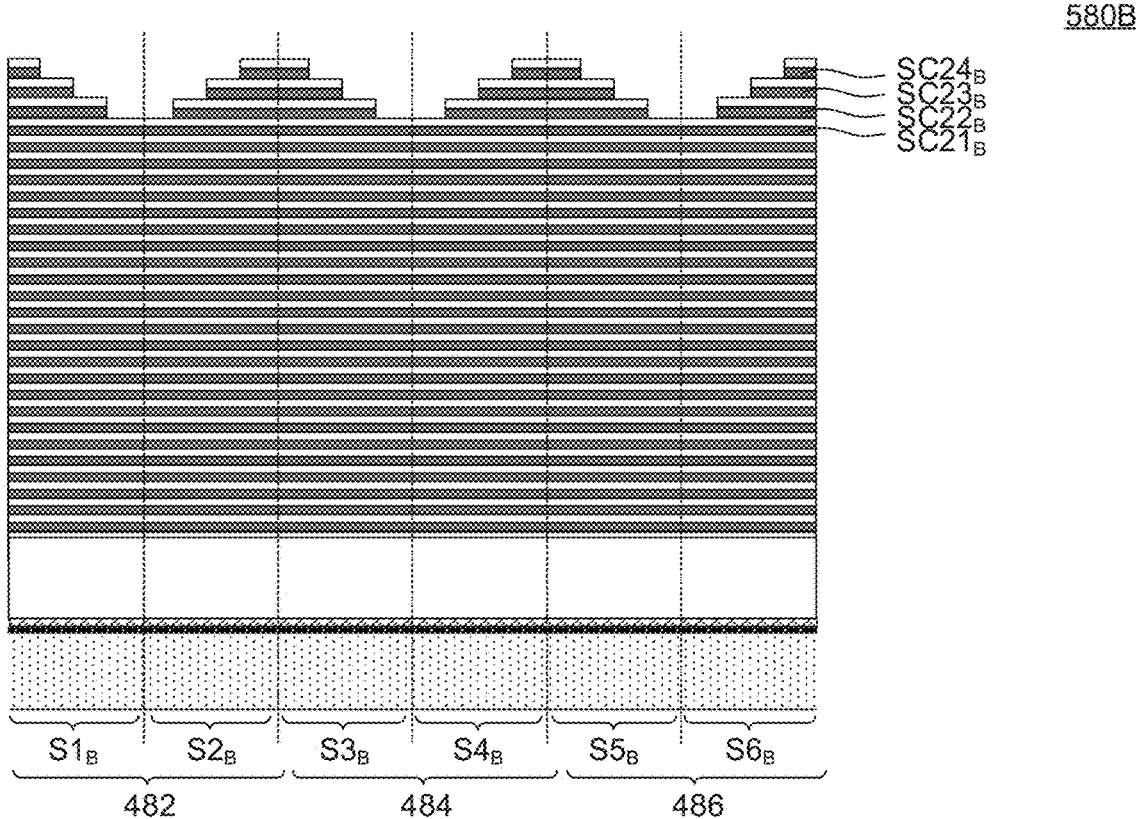

FIGS. 5C-5D represent a cross-sectional view of staircase regions 580A and 580B of a 3D memory device after forming a first staircase structure at each of staircase regions $480_A$ and $480_B$, where the first staircase structure has four steps (M=4) at each of the staircase regions 580A and 580B. As shown in FIGS. 5C-5D, the first staircase structure exhibits four steps (M=4), and each of the four steps is one level.

Figure 6A:
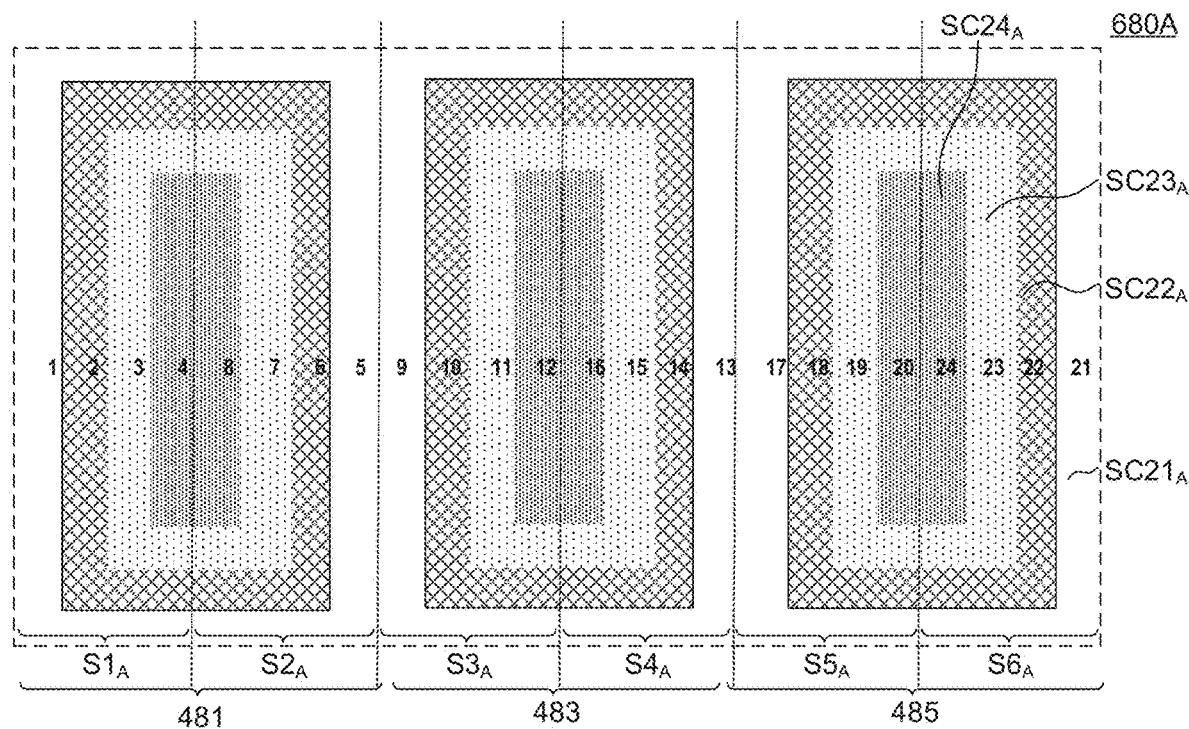
FIGS. 6A-6B illustrate a top view of staircase regions of a 3D memory device after forming a second staircase structure over the first staircase structure at each of staircase regions, in accordance with some embodiments.
Figure 6B:
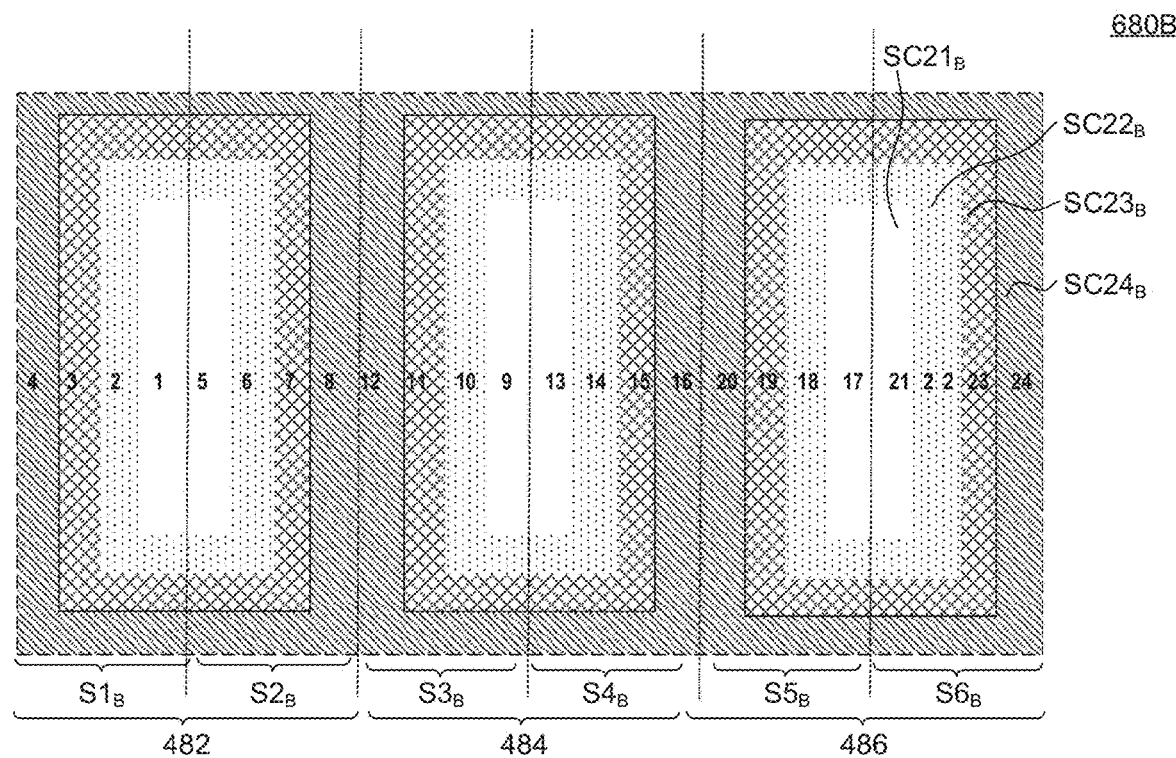
Figure 6C:
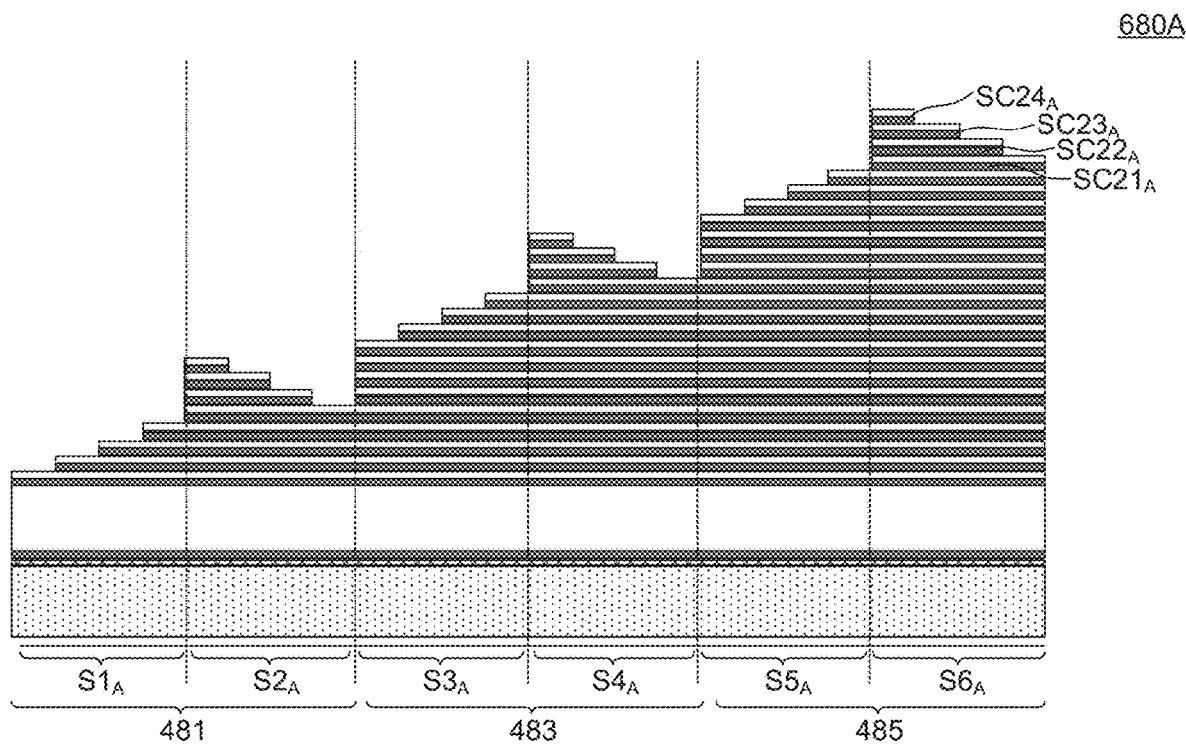
FIGS. 6C-6D illustrate a cross-sectional view of staircase regions of a 3D memory device after forming a second staircase structure over the first staircase structure at each of staircase regions, in accordance with some embodiments.
Figure 6D:
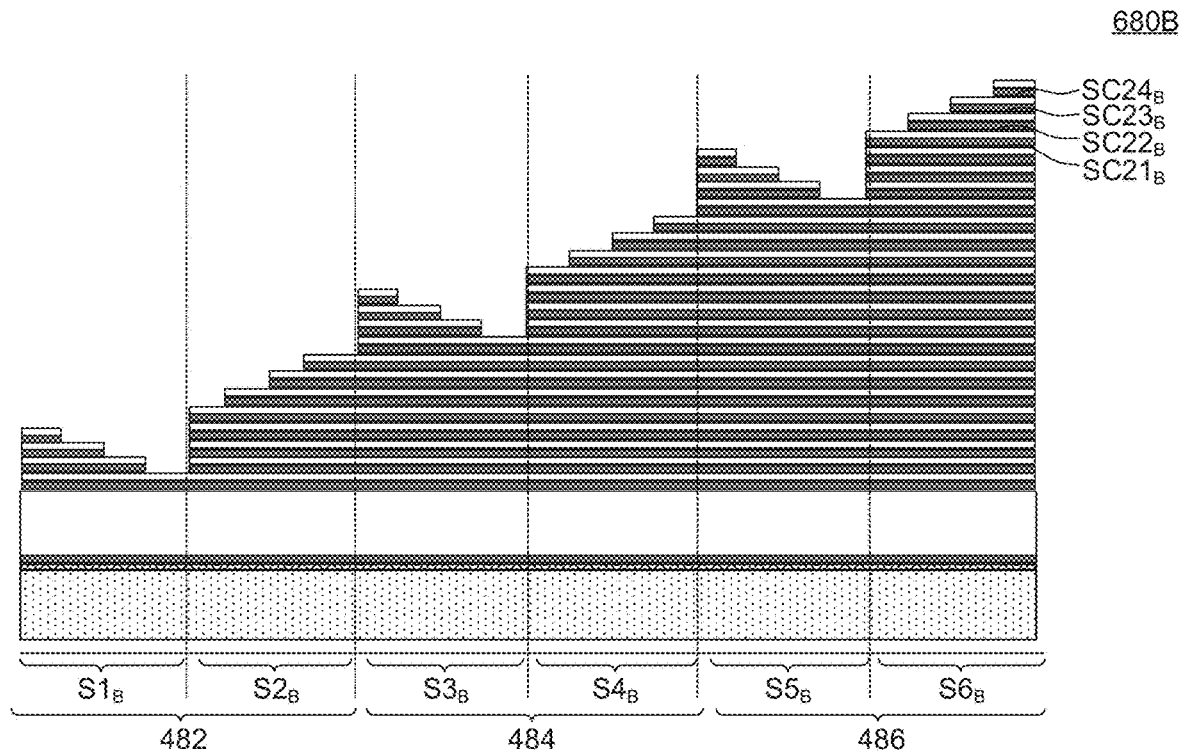

FIGS. 6A-6D show some embodiments of a top view of staircase regions 680A and 680B of a 3D memory device after forming a second staircase structure over the first staircase structure at each of staircase regions 680A and 680B of a 3D memory device (e.g., superimpose the second staircase structure on the first staircase structure). FIGS. 6A-6B show a top view of staircase regions 680A and 680B of a 3D memory device and FIGS. 6C-6D show a cross-sectional view of staircase regions 680A and 680B of the 3D memory device. The forming of second staircase structure includes applying a repetitive etch-trim process using a mask stack (not shown) formed and patterned over a top surface of 3D memory device (3D memory device 580A and 580B as shown in FIGS. 5A-5B). In some embodiments, the mask stack can include photoresist or carbon-based polymer material. The mask stack exposes a first portion (e.g., $S1_A$ and $S1_B$ as shown in FIGS. 5A and 5B) of each of the staircase regions 580A and 580B in a first direction (e.g., x-direction). In some embodiments, the etch-trim process is to remove M levels of the consecutive SC layers and therefore can include the repetitive etching processes or any other wet/dry etching processes. The mask stack can then be trimmed to expose a second portion (e.g., $S2_A$ and $S2_B$ as shown in FIGS. 5A and 5B) of each of the staircase regions 580A and 580B, followed by an etching process to remove M levels of the consecutive SC layers. In some embodiments, the etch-trim process is repeated until the top surface of all the SC layers (e.g., $SC1_A$, $SC2_A$ ... $SC24_A$ as shown in FIG. 6C, and $SC1_B$, $SC2_B$ ... $SC24_B$ as shown in FIG. 6D) are exposed for electrical connection. After forming the second staircase structure, a staircase structure that has a number of 2*N*M (e.g., 2*4*3=24 as shown in FIG. 6A-6D) steps at the staircase region is formed. And each N sub-staircase region comprises 2*M steps, where each of the 2*M steps corresponds to a different SC layer such that a number of 2*M SC layers are exposed. In some embodiments, an etch-trim process to form the first staircase structure can be performed inwardly in a direction from a lateral edge boundary of the first mask stack toward a center of mask stack (e.g., FIG. 1-3, and FIG. 4A). And the top-most layer stack of the staircase structure in each sub-staircase region (e.g., sub-staircase regions 481, 483, and 485) is located at a center portion of the sub-staircase region. In some embodiments, an etch-trim process can be performed outwardly in a direction from a center of the first mask stack to a lateral edge boundary of the mask stack (e.g., FIG. 4B). And the top-most layer stack of the staircase structure in each sub-staircase region (e.g., sub-staircase regions 482, 484, and 486) is located at a boundary of the sub-staircase region.

Figure 7:
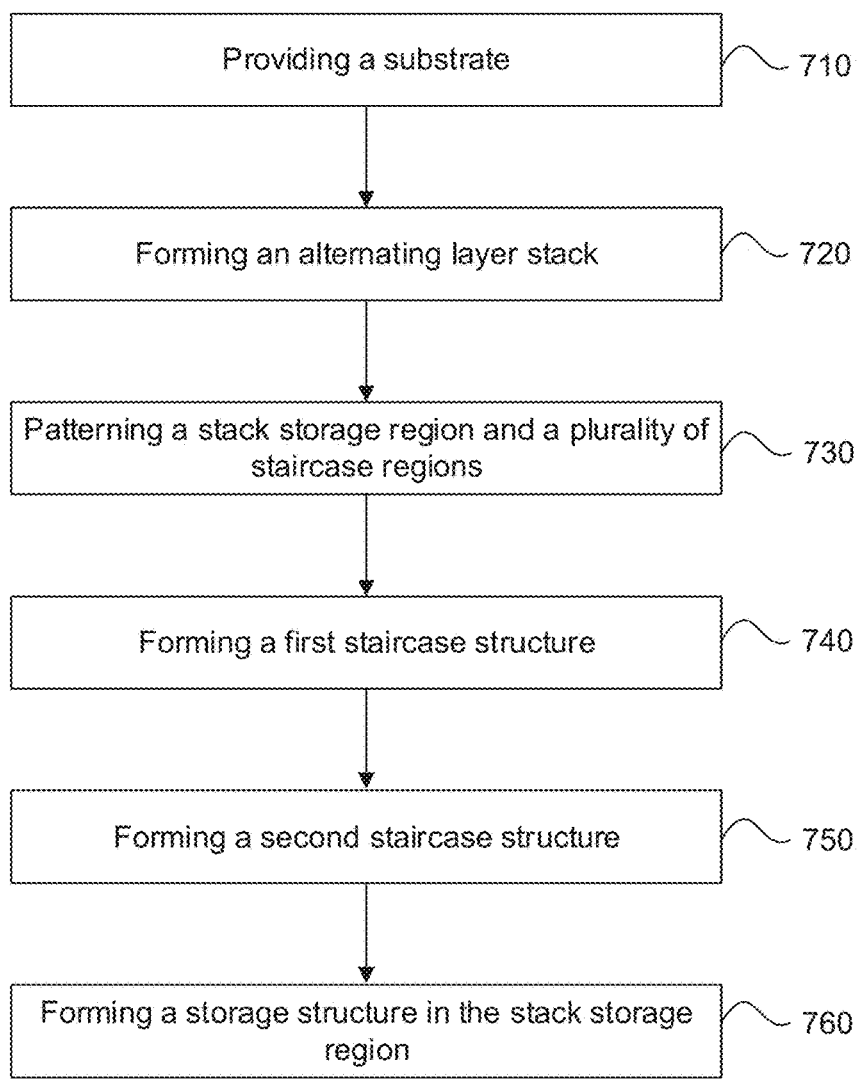
FIG. 7 is a flowchart of an exemplary method for forming a 3D memory device, in accordance with some embodiments.

Embodiments of the present disclosure further provide a method for forming a staircase structure in a 3D memory device. FIG. 7 illustrates an exemplary method 700 for forming a 3D memory device, in accordance with some embodiments. The operations of method 700 can be used to form memory device structures illustrated in FIGS. 1-6D. It should be understood that the operations shown in method 700 are not exhaustive and that other operations can be performed as well before, after, or between any of the illustrated operations. In some embodiments, some operations of exemplary method 700 can be omitted or include other operations that are not described here for simplicity. In some embodiments, operations of method 700 can be performed in a different order and/or vary.

In operation 710, a substrate is provided to from the 3D memory device. The substrate can include any suitable material for forming the three-dimensional memory structure. For example, the substrate can include silicon, silicon germanium, silicon carbide, SOI, GOI, glass, gallium nitride, gallium arsenide, plastic sheet and/or other suitable III-V compound.

In operation 720, an alternating layer stack is deposited over the substrate. Each layer stack of the alternating layer stack represents a SC layer. A SC layer can include a dielectric layer pair with a first material layer and a second material layer. In some embodiments, the first material layer can be an insulating layer and the second material layer can be a sacrificial layer, and vice versa. In some embodiments, the first material layer can be the insulating layer and the second material layer can be a conductive material layer, and vice versa. The sacrificial layer can include materials such as silicon nitride, poly-crystalline silicon, poly-crystalline germanium, poly-crystalline germanium-silicon, any other suitable material, and/or combinations thereof. The insulating layer can include materials such as silicon oxide, aluminum oxide or other suitable materials. The conductive material layer can include materials such as tungsten, titanium nitride, tantalum nitride, tungsten nitride, any other suitable material, and/or combinations thereof. Each of the insulating, sacrificial, and conductive material layers can include materials deposited by one or more thin film deposition processes including, but not limiting to, CVD, PVD, ALD, or any combinations thereof. An example of the plurality of SC layers can be alternating layers 102 and 104 as described above in FIG. 1.

At operation 730, a mask stack is used to pattern a stack storage region and a plurality of staircase regions on a top surface of the SC layers. Each of the staircase regions is adjacent to the stack storage region. In some embodiments, a first plurality of staircase regions are separated from a second plurality of staircase regions in a horizontal direction by the stack storage regions. In some embodiments, the stack storage region and the plurality of staircase regions are patterned by the mask stack using a plurality process including lithography. In some embodiments, the mask stack can include photoresist or carbon-based polymer material. An example of the stack storage region and the plurality of SC layers can be regions 460, $480_A$ and $490_A$ as described above in FIG. 4A. In some embodiments, a first mask stack is patterned to define a staircase region including a number of N sub-staircase regions over the alternating layer stack using a lithography process and N is greater than 1.

At operation 740, a first staircase structure is formed at each of the staircase regions. The first staircase structure can be formed at each of the staircase regions by repetitively performing an etch-trim process using the mask stack. The etch-trim process includes an etching process and a trimming process. In some embodiments, the etching process etches a portion of a SC layer. In some embodiments, the etching process etches a portion of a plurality of SC layers. In some embodiments, one or more etchants are used in the etching process, and each of the etchants etches the first material layer at much higher etch rate than the second material layer, or vice versa (e.g., high etching selectivity between the first material layer and the second material layer). In some embodiments, the etching process can precisely control the etching of SC layers because of high etching selectivity between the first and the second material layer. The trimming process includes a suitable etch (e.g., an isotropic dry etch or a wet etch) of the mask stack and happens at directions parallel to a surface of the substrate. The amount of trimmed mask stack can be directly relevant to the lateral dimensions of the first staircase structure. After the repetitive etch-trim process, the resulting first staircase structure includes a number of M steps, where each of the M steps is one level. In some embodiments, M is greater than 1. In some embodiments, M is 2, 3, 4, 5, or 6. In some embodiments, M is 4 (as shown in FIG. 5A-5D). The etch-trim process can be referred to the descriptions of FIGS. 1-3. The formation of the first staircase structure can be referred to the descriptions of FIGS. 4A-5D.

At operation 750, a second staircase structure is formed on the first staircase structure. In some embodiments, a mask stack is patterned to expose a first portion (e.g., $SC1_A$ and $SC1_B$) of the staircase regions and cover the rest portion of the staircase regions. In some embodiments, the mask stack covers the stack storage region. In some embodiments, the mask stack is patterned by a lithography process. An etching process, similar to the etching process used in the etch-trim process, is applied to remove M levels of SC layers from the exposed first staircase regions. The mask stack is removed after the etching process. As a result, a top-most SC layer (e.g., $SC4_A$ as shown in FIG. 6C) at the first plurality of staircase regions is M levels lower than that a top-most SC layer at the (e.g., $SC4_B$ as shown in FIG. 6C) second plurality of staircase regions. A repetitive etch-trim process using the mask stack can be performed until the top surface of all the SC layers (e.g., $SC1_A$, $SC2_A$ ... $SC24_A$ as shown in FIG. 6C and $SC1_B$, $SC2_B$ ... $SC24_B$ as shown in FIG. 6D) are exposed for electrical connection. In some embodiments, the etch-trim process includes a trimming process and an etching process that etches M of SC layers. The formation of the second staircase structure over the first staircase structure can be referred to the descriptions of FIGS. 6A-6D.

At operation 760, a storage structure, including semiconductor channels, is formed in the stack storage region. Further process steps can include forming an interconnect structure at each of the staircase regions of the 3D memory device. In some embodiments, the semiconductor channels are formed and extended through the SC layers at the stack storage region. Word lines of the 3D memory device are formed by replacing a sacrificial material layer of each SC layers with a conductor layer. The staircase structure at the staircase regions exposes a portion of each word lines at the 3D memory device, which allows the interconnect structure (e.g., a VIA structure) to provide a fan-out for each word lines to control each of the semiconductor channels.

Various embodiments described herein are directed to staircase structures of 3D memory devices and fabricating methods of the same. The exemplary fabrication method includes forming an alternating layer stack including a plurality of dielectric layer pairs disposed over a substrate; forming a first mask stack over the alternating layer stack; patterning the first mask stack to define a staircase region including a number of N sub-staircase regions over the alternating layer stack; forming a first staircase structure over the staircase region, the first staircase structure having a number of M steps at each of the staircase regions; and forming a second staircase structure on the first staircase structure. Both N and M are greater than 1 and the second staircase structure has a number of 2*N*M steps at the staircase region. In some embodiments, the method further includes forming a plurality of vertical semiconductor channels in a stack storage region on the substrate, and each of the staircase regions is adjacent to the stack storage region. In some embodiments, a 3D memory device includes an alternating layer stack disposed over a substrate; a storage structure including a plurality of vertical semiconductor channels; a plurality staircase region adjacent to the storage structure; and a staircase structure disposed at each of the staircase regions to expose a portion of a plurality of layer stacks of the alternating layer stack. In some embodiments, the staircase structure includes a number of N sub-staircase regions and N is greater than 1. In some embodiments, each N sub-staircase region includes 2*M steps and M is greater than 1. The disclosed structures and methods provide numerous benefits including, but not limiting to, reduce fabrication complexity and manufacturing cost of 3D memory devices.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a 3D memory device, comprising:
    forming an alternating layer stack comprising a plurality of dielectric layer pairs;
    forming a staircase region comprising a number of N sub-staircase regions over the alternating layer stack, wherein N is greater than 1;
    forming a first staircase structure over the staircase region, the first staircase structure having a number of M steps at each of the sub-staircase regions, wherein M is greater than 1; and
    forming a second staircase structure on the first staircase structure, wherein
       the second staircase structure has a number of 2*N*M steps at the staircase region; and
       each sub-staircase region has a number of 2*M steps, each of the 2*M steps corresponding to a different dielectric layer pair.

2. The method of claim 1, wherein the forming the staircase region comprises:
    forming a first mask stack over the alternating layer stack; and patterning the first mask stack to define the staircase region.

3. The method of claim 2, wherein the forming the first staircase structure comprises:
removing a portion of a top-most dielectric layer pair using the first mask stack;
trimming the first mask stack; and
forming the first staircase structure by repeating, sequentially, the removing and the trimming until the number of M steps are formed.

4. The method of claim 3, wherein the removing and trimming is performed inwardly in a direction from a lateral edge boundary of the first mask stack toward a center of the first mask stack.

5. The method of claim 3, wherein the removing and the trimming are performed outwardly in a direction from a center of the first mask stack to a lateral edge boundary of the first mask stack.

6. The method of claim 3, wherein the removing the portion of top-most dielectric layer pair using the first mask stack comprises dry etching, wet etching, or a combination thereof.

7. The method of claim 3, wherein the trimming the first mask stack comprises etching the first mask stack incrementally using an isotropic dry etch, a wet etch, or a combination thereof.

8. The method of claim 1, wherein the forming the second staircase structure comprises:
removing a portion of a number of M layers of dielectric layer pairs using a second mask stack;
trimming the second mask stack; and
forming the second staircase structure by repeating, sequentially, the removing and the trimming until 2*N*M steps are formed.

9. The method of claim 8, wherein the removing the portion of a number of M layers of dielectric layer pairs using the second mask stack comprises dry etching, wet etching, or a combination thereof.

10. The method of claim 8, wherein the trimming the second mask stack comprises etching the second mask stack incrementally using an isotropic dry etch, a wet etch, or a combination thereof.

11. The method of claim 1, wherein the forming the alternating layer stack comprises depositing a layer using chemical vapor deposition, physical vapor deposition, plasma-enhanced CVD, sputtering, metal-organic chemical vapor deposition, atomic layer deposition, or a combination thereof.

12. The method of claim 1, wherein the forming the alternating layer stack comprises disposing a plurality of dielectric layer pair on a substrate, wherein each dielectric layer pair comprises a first material layer and a second material layer.

13. The method of claim 1, wherein the forming the 3D memory device further comprises forming an alternating conductor/dielectric stack comprising a plurality of conductor and dielectric layer pairs.

14. The method of claim 1, further comprising:
forming a plurality of vertical semiconductor channels in a stack storage region, wherein each of the staircase regions is adjacent to the stack storage region.

15. The method of claim 14, further comprising:
performing a lithography process to define a first plurality of staircase regions and a second plurality of staircase regions, wherein the first plurality of staircase regions and the second plurality of staircase regions are separated by the stack storage region.

16. A method for forming a 3D memory device, comprising:
forming a plurality of dielectric layer pairs, wherein each dielectric layer pair comprises a sacrificial layer and an insulating layer;
forming a first staircase structure in a staircase region, wherein:
the staircase region comprises N number of sub-staircase regions; and
the first staircase structure exposes portions of M number of dielectric layer pairs in each sub-staircase region; and
forming a second staircase structure in the staircase region, wherein:
the second staircase structure exposes portions of 2*N*M number of dielectric layer pairs; and
each sub-staircase region exposes portions of 2*M number of dielectric layer pairs.

17. The method of claim 16, wherein the forming the first staircase structure comprises:
forming a first mask stack over the plurality of dielectric layer pairs; and
patterning the first mask stack to define the staircase region and sub-staircase regions.

18. The method of claim 17, wherein the forming the first staircase structure further comprises, in each sub-staircase region:
removing a portion of each dielectric layer pair exposed by the first mask stack or an upper dielectric layer pair;
trimming the first mask stack to expose another portion of a top-most dielectric layer pair; and
forming the first staircase structure by repeating, sequentially, the removing and the trimming until the portions of M number of dielectric layer pairs are exposed.

19. The method of claim 16, wherein the forming the second staircase structure in the staircase region comprises:
etching M number of dielectric layer pairs in an area exposed by a second mask stack;
trimming the second mask stack; and
forming the second staircase structure by repeating, sequentially, the etching and the trimming until the portions of 2*N*M number of dielectric layer pairs are exposed.

20. The method of claim 19, wherein the trimming the second mask stack comprises exposing a half of the first staircase structure inside one of the N number of sub-staircase regions.

* * * * *